United States Patent
Yao et al.

(10) Patent No.: US 7,479,188 B2
(45) Date of Patent: Jan. 20, 2009

(54) PROCESS FOR PRODUCING GAN SUBSTRATE

(75) Inventors: Takafumi Yao, Tsukuba (JP); Takuma Suzuki, Sendai (JP); Hang-ju Ko, Sendai (JP); Agus Setiawan, Sendai (JP)

(73) Assignee: Tohoku Techno Arch Co., Ltd. (JP)

( * ) Notice: Subject to any disclaimer, the term of this patent is extended or adjusted under 35 U.S.C. 154(b) by 733 days.

(21) Appl. No.: 10/549,018

(22) PCT Filed: Mar. 19, 2004

(86) PCT No.: PCT/JP2004/003742

§ 371 (c)(1),
(2), (4) Date: Sep. 15, 2005

(87) PCT Pub. No.: WO2004/083499

PCT Pub. Date: Sep. 30, 2004

(65) Prior Publication Data

US 2006/0252164 A1 Nov. 9, 2006

(30) Foreign Application Priority Data

Mar. 19, 2003 (JP) .............................. 2003-75480

(51) Int. Cl.
*C30B 25/18* (2006.01)
(52) U.S. Cl. .................... 117/90; 117/95; 117/97; 117/101; 117/915
(58) Field of Classification Search .............. 117/101, 117/94, 97, 90, 915
See application file for complete search history.

(56) References Cited

U.S. PATENT DOCUMENTS

| 5,620,557 A | 4/1997 | Manabe et al. ............... 438/507 |
| 5,770,887 A | 6/1998 | Tadatomo et al. ........... 257/613 |
| 6,177,292 B1 * | 1/2001 | Hong et al. .................... 438/46 |

FOREIGN PATENT DOCUMENTS

JP 11-145057 5/1999

OTHER PUBLICATIONS

"Effects of an extremely thin buffer on heteroepitaxy with large lattice mismatch", Chen et al., American Institute of Physics, Applied Physics Letters, May 2001, vol. 78, No. 21, pp. 3352-3354.
"Layer-by-layer growth of ZnO epilayer on Al2O3(0001) by using a MgO buffer layer", Chen et al., American Institute of Physics, Applied Physics Letters, Jan. 2000, vol. 76, No. 5, pp. 559-561.
"Control of polarity of heteroepitaxial ZnO films by interface engineering", Applied Surface Science 190, 2002, pp. 491-497.

* cited by examiner

*Primary Examiner*—Robert M Kunemund
(74) *Attorney, Agent, or Firm*—Hayes Soloway P.C.

(57) ABSTRACT

A process for producing an inexpensive large high-quality GaN substrate which comprises forming a MgO buffer layer on a high-quality substrate, generating a ZnO layer on the MgO buffer layer while performing polarity control, growing a GaN layer on the ZnO layer while performing polarity control, and melting the ZnO layer, thereby producing a GaN substrate.

6 Claims, 10 Drawing Sheets

PROCESS FOR PRODUCING GAN SUBSTRATE

TECHNICAL FIELD

The present invention relates to a process for producing a GaN substrate.

BACKGROUND ART

Production methods of GaN substrate which have been attempted so far are roughly classified to four. The first is a melt growth method, which comprises growing bulk crystal of GaN from a GaN melt under high pressure, but has not be technically established. Further, it is not known whether growth of a large crystal substrate of 1 inch or more is possible in the future or not.

The second is a solution growth method, which comprises dissolving GaN in a proper solvent (e.g., sodium) to prepare a solution, and growing the bulk crystal therefrom, but has not been technically established yet.

The third method comprises growing a GaN thick film on a sapphire substrate by CD (chemical vapor deposition) or MOCVD (metal organic chemical vapor deposition), and then detaching the GaN film by a lift-off method using laser. According to this method, formation of a large substrate is possible because the substrate size is determined depending on the sapphire substrate, but a low yield is the bottleneck.

The fourth method comprises growing a GaN thick film on a GaAs substrate by CVD or MOCVD, and thereafter melting the GaAs substrate with an acid or the like, thereby producing a GaN substrate. According to this method, also, formation of a large substrate is possible, but a high cost is the bottleneck.

Fifthly, it has been also adapted to form a ZnO layer on a sapphire substrate, generate a GaN layer on the ZnO layer, and then melt the ZnO layer to take out a GaN substrate.

In this case, it is known that use of a MgO buffer layer on sapphire is effective in improving the surface shape of the ZnO layer grown on the buffer layer (refer to Non-patent Literatures 1 and 2).

[Non-Patent Literature 1]
Chen Y, Ko H J, Hong S K, and Yao T. Layer-by-layer growth of ZnO epilayer on Al2O3 (0001) by using a MgO buffer layer, Appl. Phys. Lett., 2000; 76: 559

[Non-Patent Literature 2]
Chen Y, Hong S K, Ko H J, Kirshner V, Wenisich H, Yao T, Inaba K, and Segawa Y. Effects of an extremely thin buffer on heteroepitaxy with large lattice mismatch, Appl. Phys. Lett., 2001; 78: 3352.

DISCLOSURE OF THE INVENTION

The present invention has an object to provide a process for producing an inexpensive large high-quality GaN substrate.

To attain the above object, the present invention is characterized by forming a MgO buffer layer on a high-quality substrate, generating a ZnO layer on the MgO buffer layer while performing polarity control, growing a GaN layer on the ZnO layer while performing polarity control, and melting the ZnO layer, thereby producing a GaN substrate.

Otherwise, the MgO buffer layer is annealed to grow a ZnO layer of Zn polarity, and a GaN layer of Ga polarity is grown thereon while preventing nitriding of the surface of the ZnO layer.

Further, a ZnO layer of O polarity is formed on the MgO buffer layer, and a GaN layer of Ga polarity is grown after nitriding the surface of the ZnO layer or depositing an inversion symmetric thin film thereon.

The GaN layer may be obtained by forming a low-temperature GaN buffer layer and then growing high-temperature GaN.

BRIEF DESCRIPTION OF THE DRAWINGS

FIGS. 3(a) and (b) are AFM photographs for illustrating the effect of annealing treatment;

FIGS. 4(a) and (b) are views showing results by omega scans;

FIGS. 6(a) and (b) are AMF photographs of the surfaces of ZnO layers subjected to O-plasma treatment (Sample 1) (a) and subjected to $NH_3$ treatment (Sample 2) (b);

FIGS. 9(a) and (b) are views illustrating the crystal polarity control of GaN.

BEST MODE FOR CARRYING OUT THE INVENTION

In the present invention, MgO buffer is grown on a high-quality substrate, a ZnO single crystal film is formed thereon, and a GaN single crystal film is further grown thereon. At this time, the GaN single crystal film is grown while performing polarity control, and ZnO is melted, whereby a GaN single crystal substrate is separated.

According to this, a high-quality GaN single crystal of Ga polarity can be obtained.

A preferred embodiment of the present invention will be described in reference to the accompanying drawings.

Figure 01:
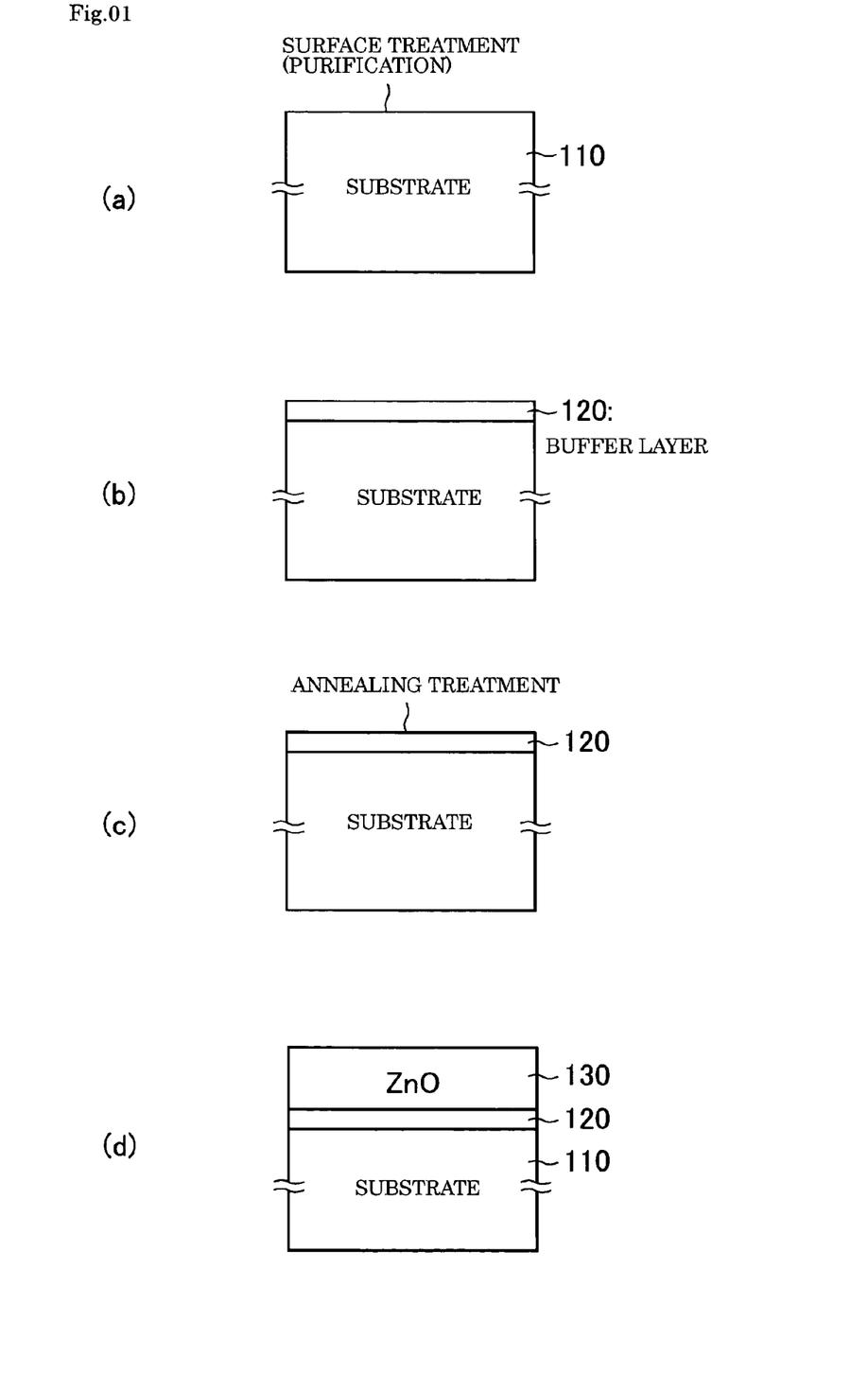
FIGS. 1(a) to (d) are views showing a process for producing a GaN substrate.
Figure 02:
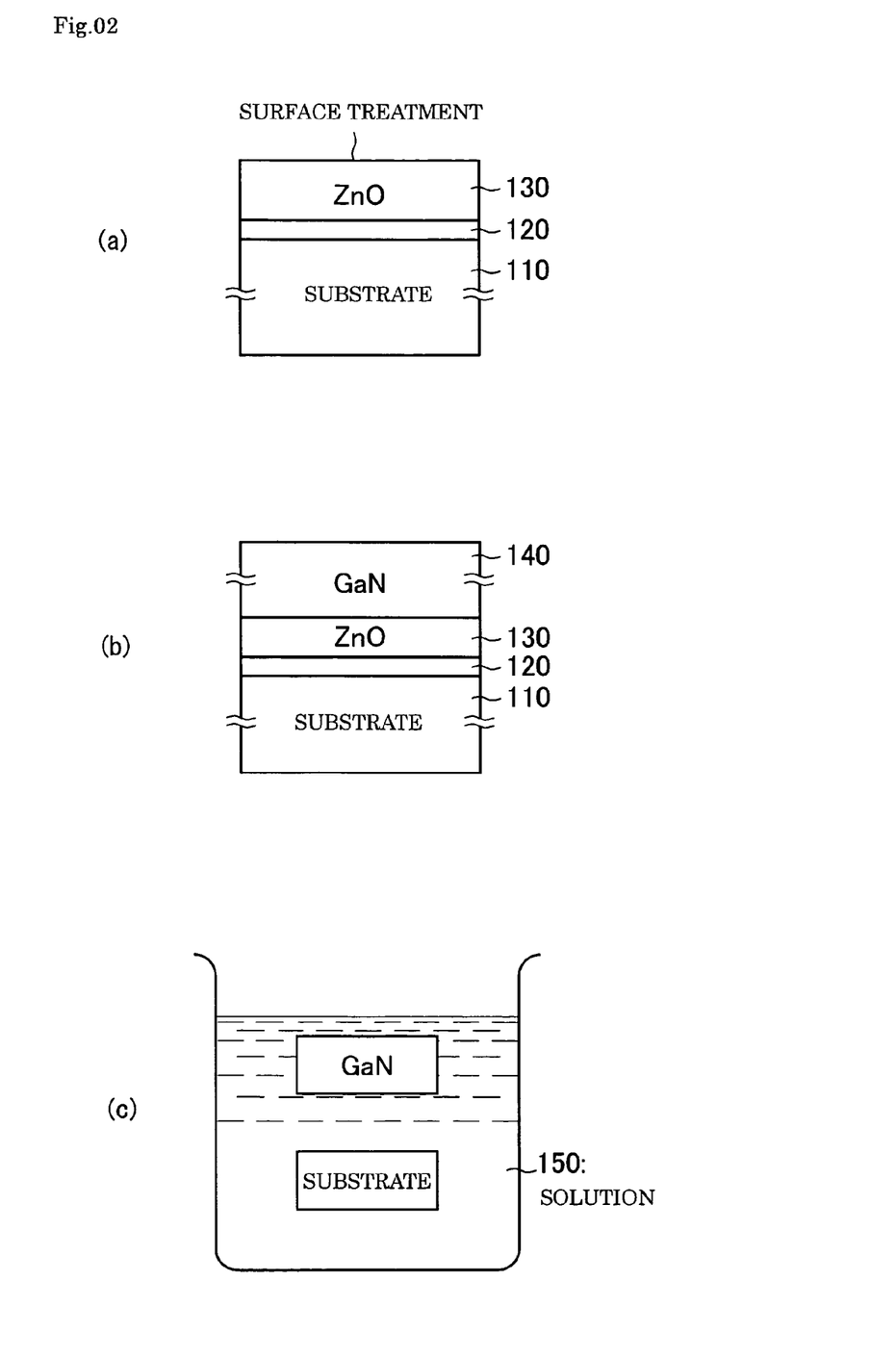
FIGS. 2(a) to (c) are views showing the rest of the process for producing a GaN substrate of FIG. 1.

As an example, a procedure for producing a GaN substrate, using sapphire substrate as the high-quality substrate, is described in detail in reference to FIGS. 1 and 2.

(1) A sapphire substrate (C-plane or A-plane) 110 is purified. A well-known purification method can be adapted therefor (refer to FIG. 1(a)).

(2) A MgO single crystal thin film (buffer layer) 120 at 2 nm or less thick is deposited thereon. This growth was carried out in conditions of substrate temperature: 300-800° C. and growth rate: 10 nm or less per min by means of MEB in the example described later, but any one of HVPE, MOCVD, and plasma CVD can be also employed (refer to FIG. 1(b)).

(3) The MgO buffer layer is annealed in oxygen atmosphere, oxygen plasma atmosphere or ultra-high vacuum at a temperature ranging from 800° C. to 1200° C. for 25 minutes or more (refer to FIG. 1(c)).

(4) ZnO 130 is grown in a film thickness of 0.1 µm or more. This was carried out by MBE in the example described later, but HVPE, MOCVD or plasma CD may be employed (refer to FIG. 1(d)).

(5) GaN is grown on the surface of the ZnO while preventing initial nitriding. Namely, the growth of GaN is started without allowing exposure the ZnO surface to ammonia or nitrogen plasma for 30 seconds or more (refer to FIG. 2(a)). Therefore, for example, an inert gas atmosphere can be employed.

(6) GaN is grown by a predetermined thickness (refer to FIG. 2(b)). In the example, this growth was carried out by MBE, but any one of HVPE, VOCVD, and plasma CVD may be employed.

(7) The GaN film is separated by being dipped in an acidic solution such as hydrochloric acid, and a free-standing substrate is formed (refer to FIG. 2(c)). In the example, hydrochloric acid heated to 80° C. was employed. However, any acid such as sulfuric acid or buffer hydrofluoric acid can be used. Further, any alkali such as ammonium fluoride can be also used.

The point of the above processes is the annealing treatment of (3) and the growth start of GaN of (5). The annealing treatment of the MgO buffer layer causes the ZnO film to be grown thereon to have Zn polarity, and when GaN is further grown on the surface of the ZnO film while preventing the initial nitriding thereof, the GaN is also caused to have Ga polarity, and high-quality GaN is consequently grown. The ZnO film has O polarity if it is not subjected to the annealing treatment.

The exposure of the surface of the ZnO film to O-plasma or oxygen/ozone, or to $NH_3$ or nitrogen plasma causes the GaN grown thereon to have Ga polarity or N polarity. Accordingly, the crystal polarity can be controlled thereby. This control of crystal polarity will be described in detail later.

In the process (6), after a thin buffer layer of low-temperature GaN (LT-GaN) (e.g., about 100 nm) is grown, high-temperature GaN is grown, whereby the crystallinity can be improved. This will be also described in detail later.

The annealing treatment to the MgO buffer layer is also effective in reducing the defect density and in enhancing the quality of ZnO layer. The defect density of a GaN layer which is grown on a ZnO layer with low defect density is naturally reduced.

The reduction in defect density and enhancement in quality of ZnO layer by the annealing treatment are described below in reference to FIGS. 3 to 5.

<Annealing Treatment>

The ZnO layer was grown on a LT-MgO (low-temperature magnesium) buffer layer or an annealed LT-MgO buffer layer on c-sapphire by P:MBE. The substrate was purified with acetone and methanol in an ultrasonic cleaner, and then chemically etched at 160° C. for 15 minutes in a 1:3 solution of $H_2SO_4$ (96%): $H_3PO_4$ (85%).

Prior to growth, the substrate was thermally cleaned at 750° C. for 1 hour within a preparation chamber. Thereafter, the substrate was treated with oxygen plasma at 650° C. for 30 minutes for forming an oxygen terminal c-sapphire surface.

The structure of the prepared sample is as follows. The MgO buffer layer is continuously formed on the cleaned c-sapphire at 700° C. and 490° C. LT-ZnO buffer layer is then grown thereon at 490° C., and then annealed at 750° C. for 3 minutes. Thereafter, HT-ZnO layer is grown at 700° C. In case of ZnO layer grown on annealed MgO buffer, the LT-MgO buffer layer is annealed at 800° C. for 25 minutes. The thickness of the HT-ZnO layer is about 800 nm.

Figure 03:
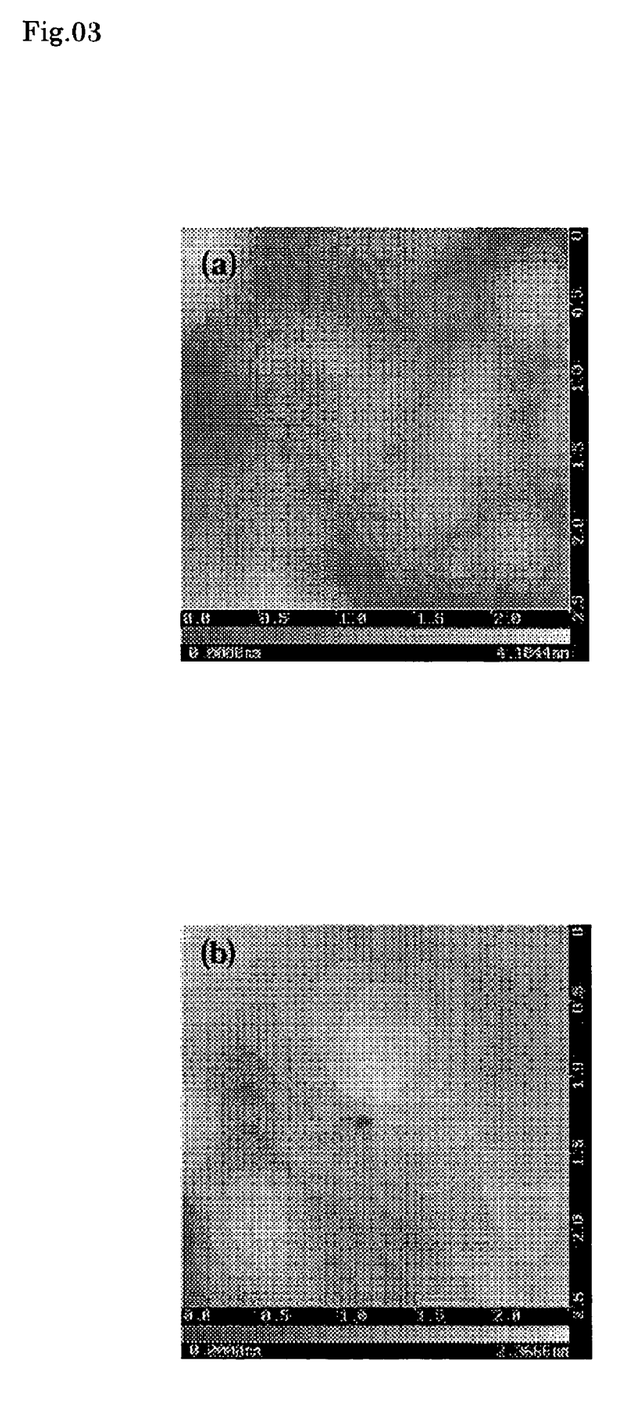

FIG. 3 show AFM (atomic force microscope) photographs of ZnO layer grown on LT-MgO buffer (a) and ZnO layer grown on annealed LT-MgO buffer (b). The root-mean-square (rms) values of roughness within a scanning area of 2.5 µm×2.5 µm are 1.1 nm in (a) and 0.76 nm in (b), respectively. The means of level height (size of terrace) are 0.21 nm (94 nm) in (a) and 0.25 nm (245 nm) in (b). These photographs show that high-temperature annealing of LT-MgO buffer enhances the surface migration of adatoms, resulting in formation of a larger terrace on the surface and ensuring of a smoother surface form.

Figure 04:
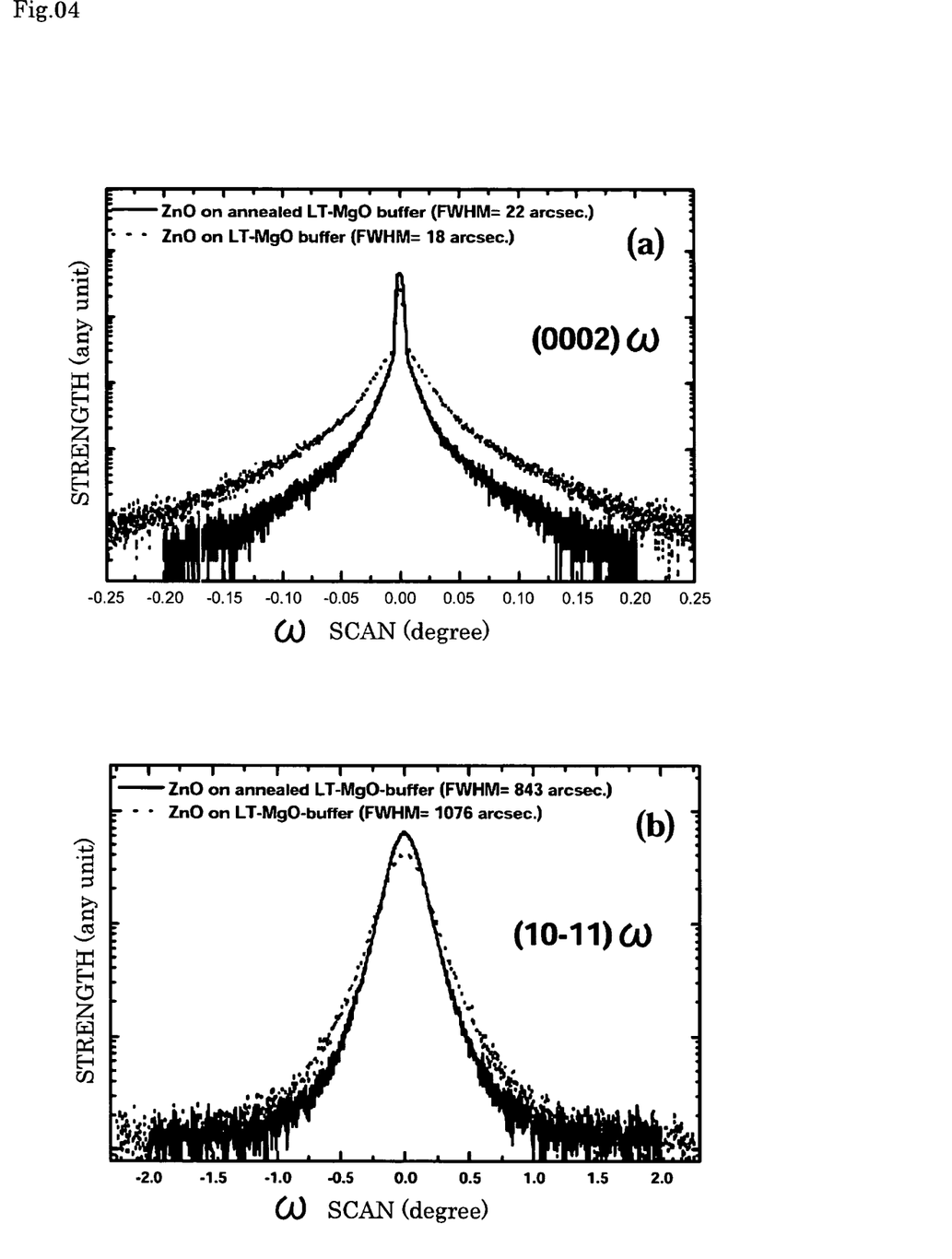

As shown in FIG. 4, FWHM (full width at half maximum) values (arcsec) of omega scans with (0002)ω and (10-11)ω are 18 (1079) and 22 (843) for ZnO layers grown on LT-MgO buffer and on annealed LT-MgO buffer respectively. Namely, the same low FWHM values for two samples of the (0002)ω scan show that the both have low-screw dislocation densities. Compared with (0002)ω, the significant extension of (10-11)ω reflection shows the presence of a large density of edge-type dislocation. All types of dislocations (edge, screw, composite) never extend the (10-11)ω reflection.

The (0002)ω reflection is sensitive only to screw-type and composite-type dislocations. Although the FWHM value by (10-11) omega scan of the ZnO layer grown on annealed MgO buffer is smaller than that of the layer grown on LT-MgO buffer, this shows a further small edge-type dislocation density.

Figure 05:
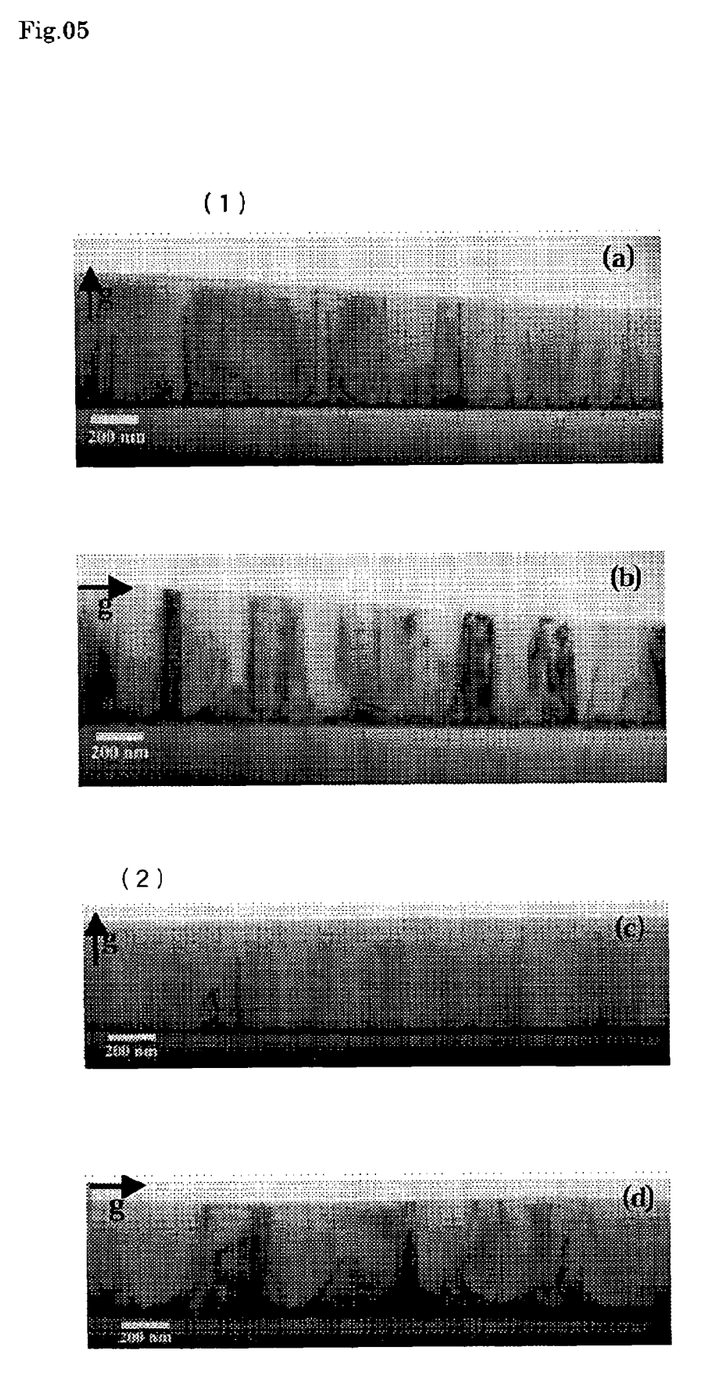
FIGS. 5(a) to (d) are TEAM (transmission electron microscope) photographs of ZnO layer, which show dislocation distributions.

Since the type or density of dislocation can be found from bright-field two-beam cross-sectional TEM photographs, the photographs are shown in FIG. 5. FIGS. 5(a) and (b) show ZnO layer grown on LT-MgO buffer, wherein the incorporated dislocations are distributed as 15% screw type (Burgers vectors b=[0001]), 67% edge type (Burgers vectors b=⅓<11-20>), and 18% composite type (Burgers vectors b=⅓<11-23>). FIGS. 5(c) and (d) show ZnO layer grown on annealed LT-MgO buffer. The incorporated dislocations are distributed as 90% edge type and 10% screw type. Most of the dislocations incorporated along c-axis are edge-type dislocations in both the ZnO samples. The edge-type dislocation can be largely reduced by the annealed LT-MgO buffer. All the dislocation densities are $1.5\times10^9$ cm$^{-2}$ and $5.2\times10^8$ cm$^{-2}$ for the ZnO layers grown on LT-MgO and on annealed LT-MgO buffers respectively. It is confirmed from the result of TEM (transmission electron microscope) that the dislocation density of ZnO layer is reduced by the annealing of the LT-MgO buffer layer. These results are matched to the above-mentioned HRXRD.

As described above, the dislocation density of the thus-formed ZnO layer can be reduced, compared with the case using no MgO buffer layer. The GaN layer grown on this ZnO layer can have a dislocation density of the same degree, and the dislocation density can be thus reduced.

<Control of Crystal Polarity>

The control of crystal polarity depending on growth start of GaN on ZnO layer will be further described in detail in reference to FIGS. 6 to 9.

The actually employed generation method of GaN layer is described below.

The growth of GaN epilayer was carried out by MBE with assist of ammonia on a ZnO (~1.3 µm)/MgO (~3 nm)/c-sapphire template grown by P-MBE, except MgO is not subjected to high-temperature annealing. Solid Ga and $HH_3$ gas were used as supplying sources of Ga and N, respectively. The same result was obtained in case of using nitrogen plasma as the supplying source of N. The substrate temperature for growing GaN is 800° C. The GaN growth rate is 1 µm/h, with Ga beam pressure of $2.8\times10^{-7}$ Torr ($3.7\times10^{-5}$ Pa) and flow velocity of $NH_3$ Of 10 sccm.

Two sets of samples subjected to different treatments just before growth of GaN were prepared.

Sample 1: GaN epilayer grown on a ZnO template preliminarily exposed to O-plasma Sample 2: GaN epilayer grown on a ZnO template preliminarily exposed to $NH_3$ These ZnO thin films were grown on c-sapphire ($Al_2O_3$ (0001)) substrate by P-MBE. After growing on the ZnO templates, the pattern by reflection high energy electron diffraction (RHEED) of ZnO layer grown is a stripe shape by specular reflection points, which suggests a smooth surface. The root-means-square (rms) value of surface roughness measured by AFM (atomic force microscope) is smaller than 1 nm for an area of 5 μm×5 μm.

CBED (convergence beam electron diffraction) was adapted to confirm the polarity of the ZnO templates. CBED patterns were observed in some portions of the samples by use of a 20 nm-probe.

Figure 06:
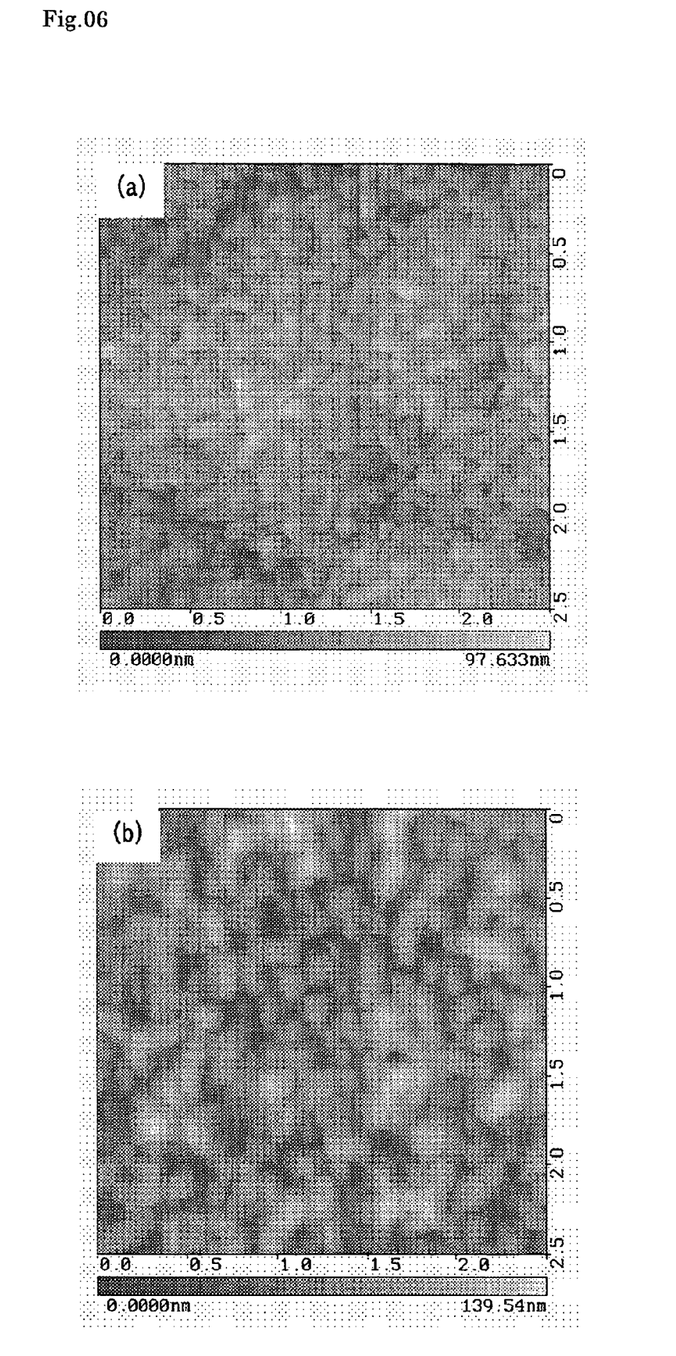

FIGS. 6(a) and (b) show an AFM image of the surface of GaN grown on ZnO preliminarily exposed to O-plasma (Sample 1), and an AFM image of the surface of GaN grown on ZnO preliminarily exposed to $NH_3$ (Sample 2), respectively. The root-mean-square values of roughness of Samples 1 and 2 are 97.6 nm and 23.8 nm, respectively. These values show that the GaN grown on ZnO preliminarily exposed to $NH_3$ has a smoother surface. It is reported by AFM observations for surface form that a smooth surface is obtained on GaN layer of Ga polarity, while a rough surface by hexagonal protrusions is observed on GaN surface of N polarity. The etching of the two GaN samples was performed in a 0.5M-KOH (10%) solution, with the etching rates of Samples 1 and 2 being set to 3.9 nm/min and 0.1 nm/min or less, respectively. It is known that the etching rate to GaN layer of Ga polarity is very low, compared with that to GaN layer of N polarity. These results suggest that Sample 1 or the GaN layer grown on ZnO preliminarily exposed to O-plasma has N polarity, and Sample 2 or the Gab; layer grown on ZnO preliminarily exposed to $NH_3$ has Ga polarity.

Figure 07:
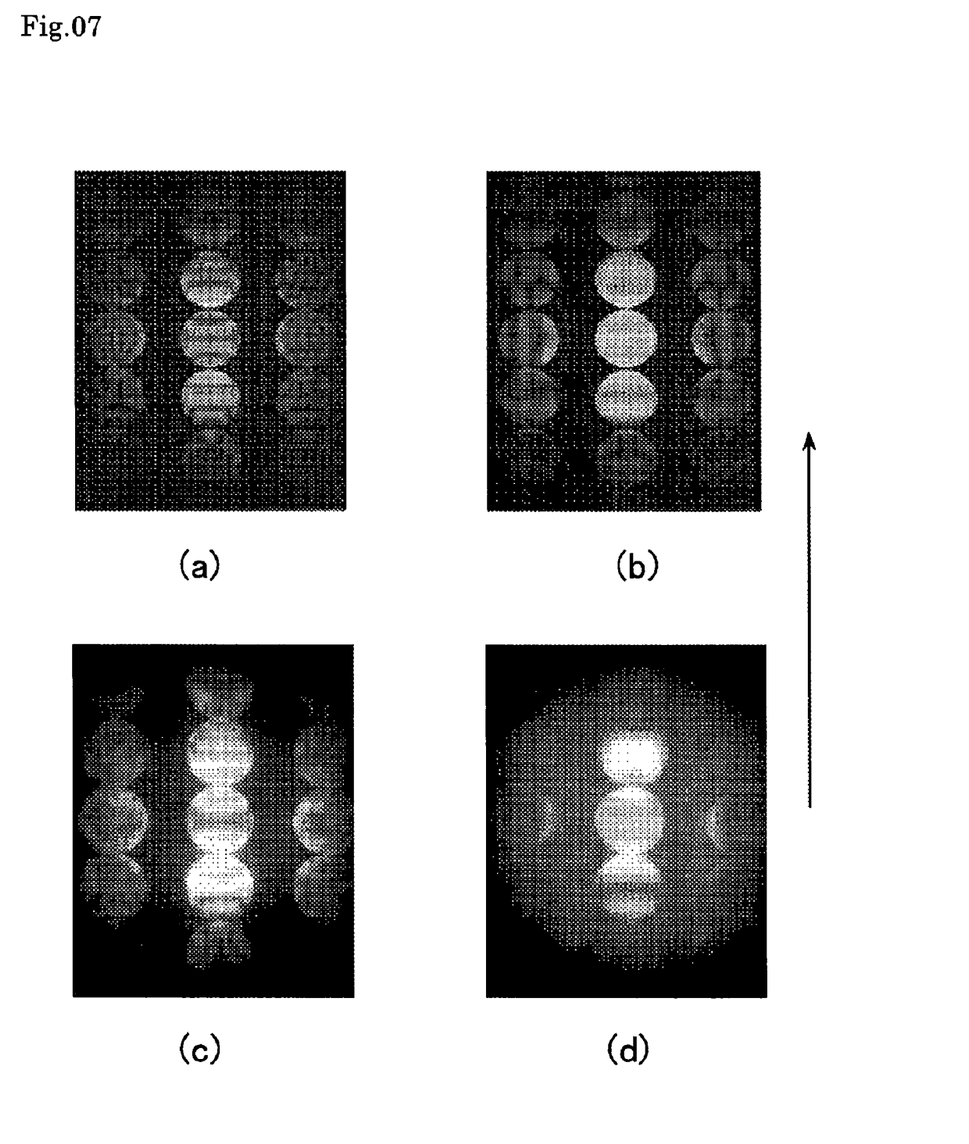
FIGS. 7(a)-(d) are views for comparing CBED patterns by simulation with the measured ones for Sample 1.

The CBED technique is widely used for determination of polarity of materials of wurtzite structure. When the polarity is changed, the symmetry to c-axis of the CBED pattern is inverted. FIGS. 7(a) and (b) show CBED patterns in zone axis [10-10] by simulation, which are determined for ZnO of O-polarity 28 nm thick (a) and for GaN of N-polarity 58 nm thick (b), respectively. FIGS. 7(c) and (d) show CBED patterns measured in zone axis [10-10] for the ZnO template (c) and GaN layer (d) of Sample 1. As shown in FIGS. 7(a) and (c), the CBED pattern by simulation of ZnO of O-polarity is the same as the measured one, which shows that the ZnO template has O-polarity. As shown in FIGS. 7(b) and (d), the CBED pattern by simulation of GaN of N polarity is similar to the measured one. This shows that the GaN layer grown on O-plasma-treated ZnO has N polarity. The exposure of O-polarity ZnO to O-plasma probably enables assistance for the growth of N-polarity GaN (anionic polarity) while retaining the surface of the O-polarity ZnO (anionic polarity).

Figure 08:
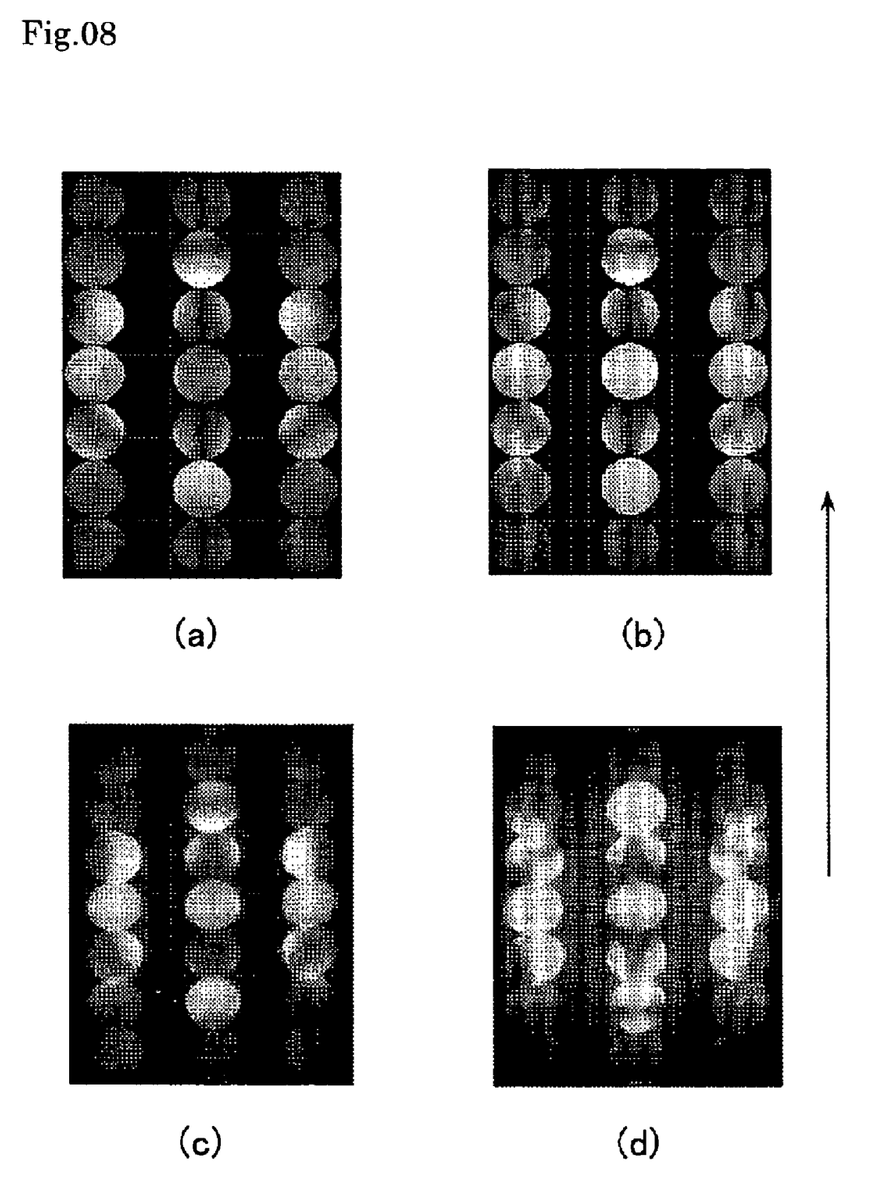
FIGS. 8(a)-(d) are views for comparing CBED patterns by simulation with the measured ones for Sample 2.

FIGS. 8(a) and (b) show CBED patterns in zone axis [11-20] by simulation, which are determined for O-polarity ZnO of 26 nm thick (a) and N-polarity GaN (b), respectively. FIGS. 8(c) and (d) show CBED patterns measured in the same zone axis for the ZnO template (c) and GaN layer (d) of Sample 2, respectively. It is found from the comparison of the CBED pattern by simulation of O-polarity ZnO (FIG. 8(a)) with the measured one (FIG. 8(c)) that the ZnO template of Sample 2 has O-polarity. It can be concluded from the comparison with the CBED pattern by simulation of N-polarity GaN shown in FIG. 8(b) that the measured CBED pattern of GaN shown in FIG. 8(d) is inverted along c-axis. This inverted CBED pattern shows that the GaN layer grown on O-polarity ZnO template exposed to $NH_3$ has Ga polarity.

Namely, the exposure of anionic polarity ZnO to $NH_3$ causes the inversion of polarity from anionic polarity to cationic polarity.

Figure 09:
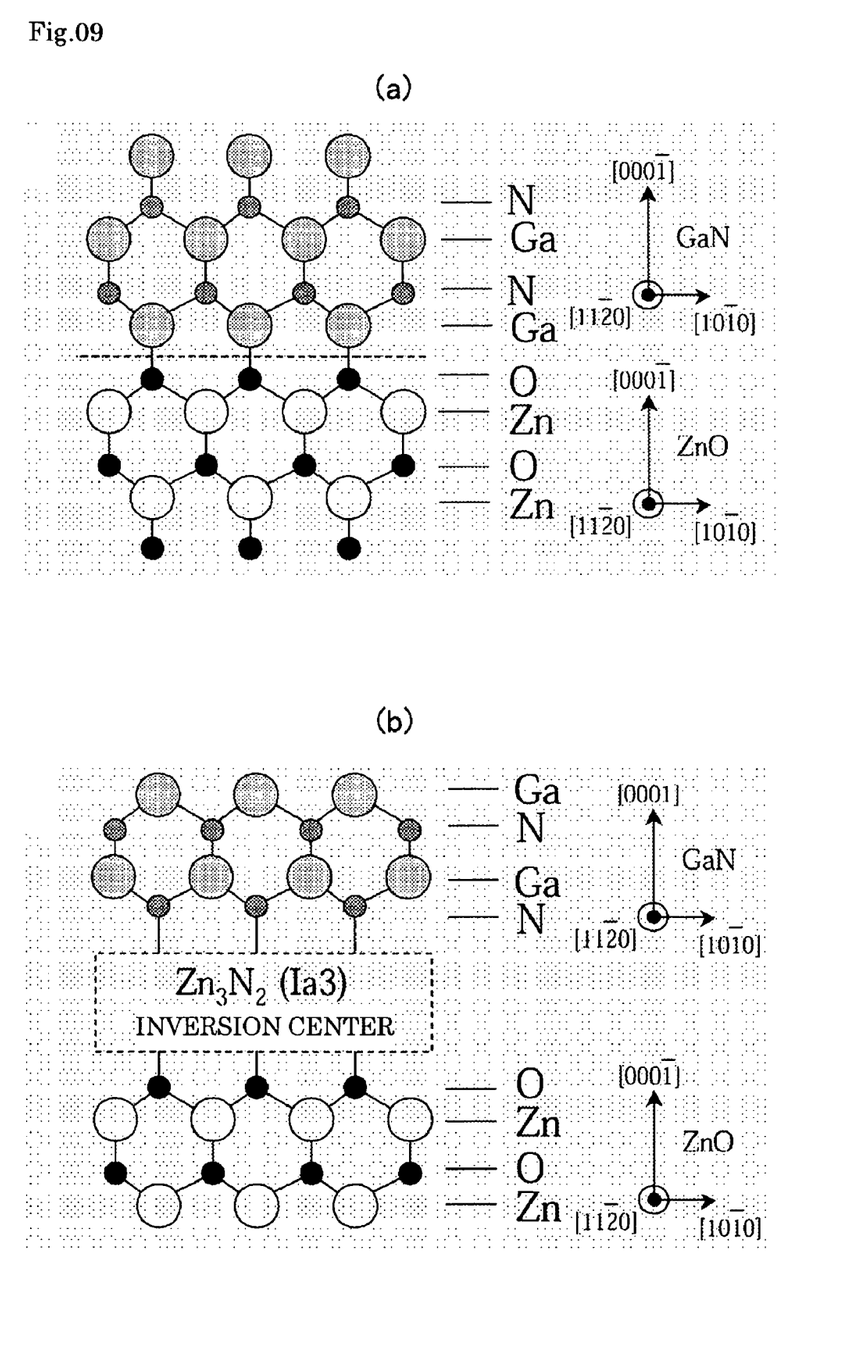

The bonding sequence in the interface of GaN/O-polarity ZnO found from the above is then described. FIG. 9 are schematic views thereof in the interface, with FIG. 9(a) showing a GaN layer grown on ZnO preliminarily exposed to O-plasma, and FIG. 9(b) showing a GaN layer grown on ZnO preliminarily exposed to $NH_3$. After O-polarity ZnO is exposed to O-plasma, O terminal is formed on the surface of ZnO. When growth of GaN starts on the ZnO surface terminated with anion, Ga (cationic) adatom stably fixes thereto, and N (anionic) adatom then bonds with Ga. The bonding sequence is ... —Zn—O—Ga—N— ... in the interface of GaN/O-plasma exposed/O-polarity ZnO as shown in FIG. 9(a).

In FIG. 9(b), where GaN is grown on O-polarity ZnO exposed to $NH_3$, the ZnO surface is changed to form an interface layer such as $Zn_3N_2$. $Zn_3N_2$ has a cubic structure (Ia3) with a lattice constant of 0.978 nm, which has inversion symmetry. Such an inversion symmetric interface layer can be inverted in crystal polarity. The (111) plane of $Zn_3N_2$ is composed of Zn atom. The space between Zn planes along [111] of $Zn_3N_2$ is 0.339 nm. The Zn surface enables bonding of N of Ga-polarity GaN with O of O-polarity ZnO, and leads the bonding sequence to ... —Zn—O—(Zn—$Zn_3N_2$—Zn)—N—Ga— .... Accordingly, the crystal polarity is inverted from anionic polarity to cationic polarity.

Although the polarity controls using O-plasma and $NH_3$ were described above, the polarity control can be performed by exposure to oxygen or ozone instead of O-plasma or by exposure to N-plasma instead of $NH_3$.

In the above example, a base layer is reacted by surface treatment, and the resulting surface reactive layer is used as an interface inversion layer. As another method, an inversion symmetry material can be laminated on the base. The crystal polarity of the upper laminate part laminated through base crystal and the interface inversion layer can be inverted also by this method. For example, MgO, which is an inversion symmetric crystal having a rock salt structure, two-dimensionally grows over the whole surface initially because the surface is satisfactorily wetted even by growth on O-polarity ZnO, and the GaN layer grown thereon consequently has Ga polarity. Of course, even on Zn polarity, the GaN formed thereon can be made to have N polarity.

<Low-Temperature GaN Buffer>

When GaN is grown on ZnO film, low-temperature GaN buffer is grown, and GaN is then grown thereon at high temperature, w hereby GaN with low defect can be obtained. This will be described in reference to FIG. 10.

Figure 10:
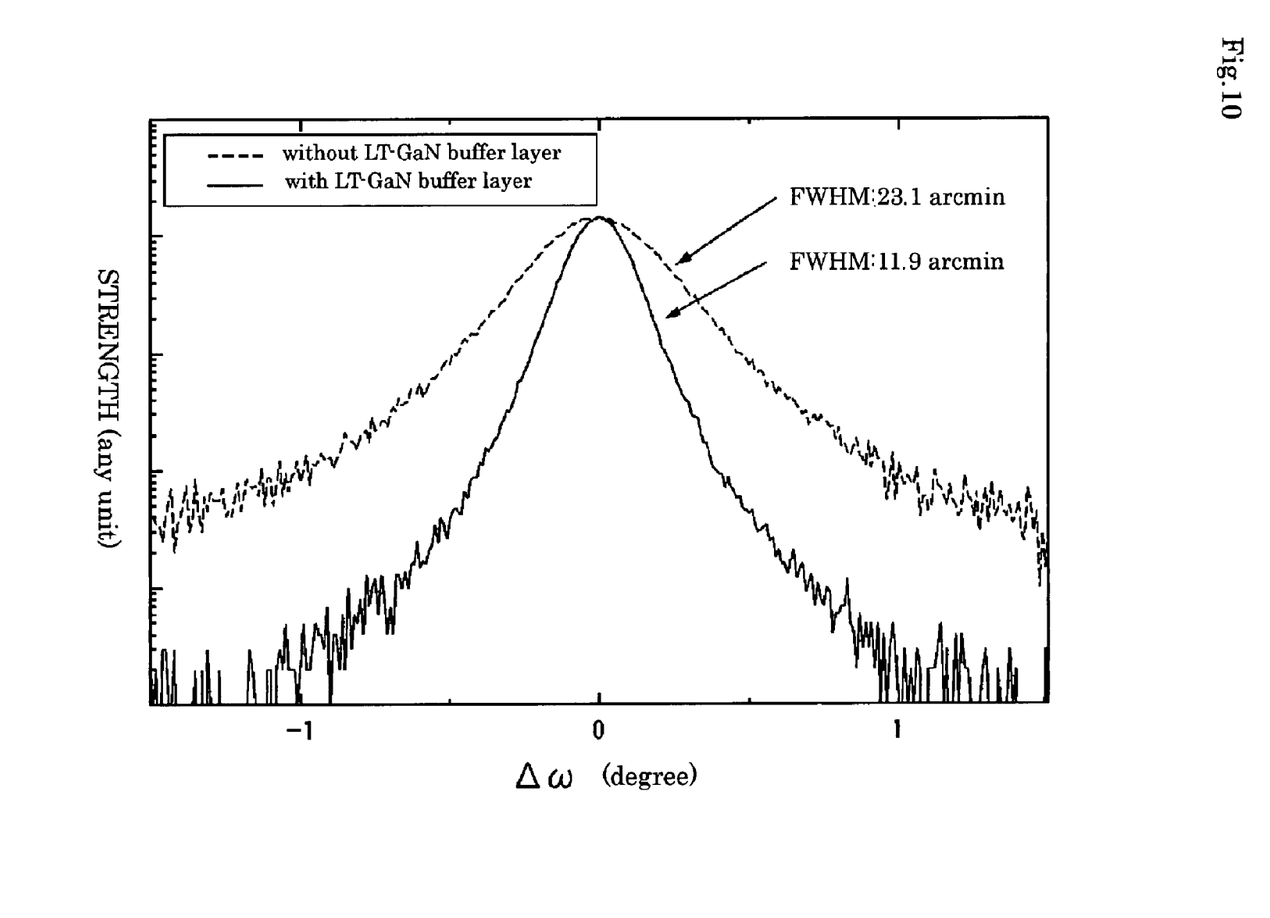
FIG. 10 is a view illustrating the effect of low-temperature GaN buffer layer.

GaN is grown on ZnO first at low temperature. FIG. 10 comparatively shows XRD (0002) omega locking curves of GaN layer with GaN grown at a high temperature of 800° C. on GaN grown at a substrate temperature of 500° C., and GaN layer grown without low-temperature GaN layer. The FWHM without LT-GaN is 23.1 arcmin, and the FWHM with LT-GaN is substantially reduced by half to 11.9 arcmin.

In this way, GaN is grown at high temperature after low-temperature GaN is grown on ZnO, whereby a high quality GaN can be obtained.

Another Embodiment

As an extension of the above producing method of GaN of (1)-(7), the following is also possible.

In the stage of (5), GaN is formed in a thickness of about 10 μm. SiO$_2$ is deposited thereon in about 100 nm. The SiO$_2$ layer is patterned in a line-and-stripe form by use of lithographic technique. The SiO$_2$ located in the stripes is removed by etching. At this time, the direction of the lines is aligned in the <11-20> direction or <1-100> direction of GaN crystal. GaN is then grown by HVPE or MOCVD. By well selecting the growth condition, a high-quality GaN film with minimized defect density is grown.

An example using a silicon substrate as the substrate for growing GaN is described below. In this case, Ca F$_2$ is used as the buffer layer.

(1) A silicon substrate is cleaned, and CaF$_2$ thin film is grown thereon.

This can be performed by an already established technique.

(2) CaF$_2$ is irradiated with an electron beam to remove F atoms on the surface.

(3) ZnO is then grown thereon. This corresponds to (4) in the above-mentioned procedure of the method for forming GaN substrate using the sapphire substrate. Thereafter, the same procedure as in (5) and following is performed, whereby a GaN substrate can be produced Instead of the above-mentioned (2), hydrogen treatment can be performed to the CaF$_2$ surface at a temperature of 500° C. or higher. Any of hydrogen, hydrogen plasma irradiation, or atomic hydrogen irradiation can be employed for this treatment. Further, electron beam treatment may be combined therewith.

Instead of the above-mentioned (2), further, oxygen plasma treatment is performed to the CaF$_2$ surface at a temperature of 500° C. or higher. Electron beam treatment may be combined therewith.

The above-mentioned annealing treatment of a MgO buffer, polarity control of GaN by surface treatment of ZnO, reduction in defect of GaN by low-temperature GaN buffer and the like can be applied independently to the production of GaN substrate. By applying them independently, the respective effects can be obtained.

The process for producing a GaN substrate of the present invention is not limited by the above embodiments, and various changes can be made within the scope departing from the gist of the present invention. For example, as the high-quality substrate, SiC, CaF$_2$, GaAs, MgO, MgAl$_2$O$_4$ and the like may be used in addition to the sapphire substrate or silicone substrate employed in the above embodiments.

The invention claimed is:

1. A process for producing a GaN substrate, comprising:
   forming a buffer layer of MgO on a high-quality substrate;
   generating a ZnO layer on said MgO buffer layer while performing polarity control;
   growing a GaN layer on said ZnO layer while performing polarity control, and
   melting said ZnO layer, thereby producing a GaN substrate.

2. The process for producing a GaN substrate according to claim 1, wherein said MgO buffer layer is annealed to grow a ZnO layer of Zn polarity, and a GaN layer of Ga polarity is grown while preventing nitriding of the surface of said ZnO layer.

3. The process for producing a GaN substrate according to claim 1, wherein a ZnO layer of O polarity is grown on said MgO buffer layer, and after the surface of said ZnO layer is nitrided, or an inversion symmetric thin film is deposited thereon, a GaN layer of Ga polarity is grown.

4. The process for producing a GaN substrate according to claim 1, wherein said GaN layer is obtained by producing a low-temperature GaN buffer layer and then growing high-temperature GaN.

5. The process for producing a GaN substrate according to claim 2, wherein said GaN layer is obtained by producing a low-temperature GaN buffer layer and then growing high-temperature GaN.

6. The process for producing a GaN substrate according to claim 3, wherein said GaN layer is obtained by producing a low-temperature GaN buffer layer and then growing high-temperature GaN.

* * * * *